(12) United States Patent
Kasagi et al.

(10) Patent No.: US 10,388,425 B2
(45) Date of Patent: Aug. 20, 2019

(54) INSULATING RESIN MATERIAL, METAL LAYER-EQUIPPED INSULATING RESIN MATERIAL USING SAME, AND WIRING SUBSTRATE

(71) Applicant: NITTO DENKO CORPORATION, Ibaraki-shi, Osaka (JP)

(72) Inventors: Tomoyuki Kasagi, Ibaraki (JP); Kou Uemura, Ibaraki (JP); Syunji Imamura, Ibaraki (JP); Yuya Kitagawa, Ibaraki (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 16/084,394

(22) PCT Filed: Mar. 16, 2017

(86) PCT No.: PCT/JP2017/010767
§ 371 (c)(1),
(2) Date: Sep. 12, 2018

(87) PCT Pub. No.: WO2017/159816
PCT Pub. Date: Sep. 21, 2017

(65) Prior Publication Data
US 2019/0074104 A1 Mar. 7, 2019

(30) Foreign Application Priority Data

Mar. 18, 2016 (JP) .................. 2016-055383
Mar. 13, 2017 (JP) .................. 2017-047072

(51) Int. Cl.
*H05K 1/03* (2006.01)
*H01B 3/48* (2006.01)
*H01B 3/44* (2006.01)

(52) U.S. Cl.
CPC .............. *H01B 3/48* (2013.01); *H01B 3/445* (2013.01); *H05K 1/03* (2013.01); *H05K 1/0373* (2013.01);
(Continued)

(58) Field of Classification Search
CPC ... H05K 1/0306; H05K 1/0353; H05K 1/0373
See application file for complete search history.

(56) References Cited

U.S. PATENT DOCUMENTS

| 4,987,274 A | 1/1991 | Miller et al. |
| 5,354,611 A | 10/1994 | Arthur et al. |

(Continued)

FOREIGN PATENT DOCUMENTS

| JP | 3-212987 A | 9/1991 |
| JP | 1-500291 A | 1/1992 |

(Continued)

OTHER PUBLICATIONS

International Search Report dated Jun. 20, 2017, issued in counterpart International Application No. PCT/JP2017/010767 (2 pages).
(Continued)

*Primary Examiner* — Jeremy C Norris
(74) *Attorney, Agent, or Firm* — Westerman, Hattori, Daniels & Adrian, LLP

(57) ABSTRACT

To obtain an insulating resin material serving as a material achieving both an excellent low specific dielectric constant and an excellent low linear thermal expansion coefficient, which has heretofore been difficult to obtain, and a metal layer-equipped insulating resin material and a wiring substrate each using the insulating resin material, provided is an insulating resin material, including: porous inorganic aggregates each having pores defined by a plurality of fine particles; and fibrils formed of polytetrafluoroethylene, wherein the fibrils are each multidirectionally oriented,
(Continued)

US 10,388,425 B2

Page 2 wherein at least one of the porous inorganic aggregates and the fibrils are connected to each other, and wherein the insulating resin material is formed of a micro network structure having a porosity of 50% or more.

12 Claims, 3 Drawing Sheets

(52) U.S. Cl.
CPC ............... *H05K 2201/0175* (2013.01); *H05K 2201/068* (2013.01)

(56) References Cited

U.S. PATENT DOCUMENTS

| | | |
|---|---|---|
| 5,429,869 A | 7/1995 | McGregor et al. |
| 5,506,049 A | 4/1996 | Swei et al. |

FOREIGN PATENT DOCUMENTS

| | | |
|---|---|---|
| JP | 5-301974 A | 11/1993 |
| JP | 6-119810 A | 4/1994 |
| JP | 8-507316 A | 8/1996 |
| JP | 2001-283640 A | 10/2001 |
| JP | 2004-43984 A | 2/2004 |
| JP | 2005-273100 A | 10/2005 |
| JP | 2007-138095 A | 6/2007 |
| JP | 2010-138021 A | 6/2010 |
| WO | 2009/038177 A1 | 3/2009 |

OTHER PUBLICATIONS

International Preliminary Report on Patentability (Form PCT/IB/338) issued in counterpart International Application No. PCT/JP2017/010767 dated Sep. 27, 2018, with Form PCT/IB/373 and PCT/ISA/237 (14 pages).

INSULATING RESIN MATERIAL, METAL LAYER-EQUIPPED INSULATING RESIN MATERIAL USING SAME, AND WIRING SUBSTRATE

TECHNICAL FIELD

The present disclosure relates to an insulating resin material serving as a material achieving both an excellent low specific dielectric constant and an excellent low linear thermal expansion coefficient, which has heretofore been difficult to obtain, and to a metal layer-equipped insulating resin material and a wiring substrate each using the insulating resin material.

BACKGROUND ART

Due to advance of electronic technology, electronic devices, such as computers and mobile communication devices, each using the high frequency band are increasing. For a wiring substrate and a multilayer wiring substrate for high frequency applications to be used for such electronic device, a material having a low specific dielectric constant is generally required. As a resin material having a low specific dielectric constant, there are given, for example, nonpolar polymer resin materials, such as polyethylene, polypropylene, polystyrene, and polytetrafluoroethylene.

However, the above-mentioned resin materials each have a high linear thermal expansion coefficient, which significantly differs from a linear thermal expansion coefficient of a metal wiring material to be formed on the substrate. Accordingly, there is a problem of, for example, peeling or breakage of wiring due to the difference in linear thermal expansion coefficient.

In order to achieve lowering of the linear thermal expansion coefficient of each of the above-mentioned resin materials, there are known techniques each involving utilizing an inorganic substance having a low linear thermal expansion coefficient, such as filling with inorganic powder and glass cloth reinforcement. Meanwhile, the inorganic substance generally has a high specific dielectric constant, and hence there is also a problem in that a specific dielectric constant of a material to be obtained is increased.

In view of the foregoing, there is a proposal of a technology for producing a substrate having a low specific dielectric constant and also having a low linear thermal expansion coefficient through use of hollow inorganic particles, which are particles each having a hollow central portion (Patent Literature 1).

However, when the hollow inorganic particles are blended with a binder, and a paste including the hollow inorganic particles is formed into a certain shape, the hollow inorganic particles are liable to be broken. With this, the water absorption rate of an insulating layer is increased, and hence, when the hollow inorganic particles are used for a substrate material or a wiring board, there is a problem in that dielectric characteristics are reduced. In order to solve such problem, there is a need to expand shells of the hollow inorganic particles. Therefore, there is a limit when an insulating resin composition having a high porosity is to be obtained through use of the hollow inorganic particles.

Meanwhile, there is a proposal that a fluoropolymer dispersion containing a fine silica filler having an average particle diameter of 2 μm or less is formed into a sheet shape through drying and aggregation (Patent Literature 2).

However, there is a need to produce a high-compression molded body owing to the use of the fine silica filler. A high porosity of more than 50% cannot be achieved, and it is difficult to reduce the specific dielectric constant of a material to be obtained.

RELATED ART DOCUMENTS

Patent Documents

PTL 1: JP-A-HEI6(1994)-119810
PTL 2: JP-A-HEI3(1991)-212987

SUMMARY OF INVENTION

However, even when each of the above-mentioned technologies is used, the lowest specific dielectric constant is no lower than about 1.94. Also when any other technology is used, a material having a specific dielectric constant lower than that is extremely difficult to obtain. Therefore, further lowering of the specific dielectric constant has been desired for years.

In addition, also a material which has blended therein an inorganic filler and further has pores has the following problem: when the material is to be brought into close contact with a metal with a hot press or the like, the amount of a polymer to enter a roughened surface of a metal layer is insufficient and the polymer does not enter the surface sufficiently, resulting in low adhesiveness.

The present disclosure has been made in view of the above-mentioned circumstances, and provides a material which has an excellent low specific dielectric constant and an excellent low linear thermal expansion coefficient and is also excellent in adhesiveness to a metal layer, which has heretofore been difficult to obtain.

According to a first embodiment of the present disclosure, there is provided an insulating resin material, including: porous inorganic aggregates each having pores, the aggregates each comprising a plurality of fine particles; and fibrils comprising a fibril made from polytetrafluoroethylene, wherein each fibril of the fibrils is multidirectionally oriented, wherein the insulating resin material has at least one connection selected from the group consisting of (i) a connection among the aggregates; (ii) a connection among the fibrils; and (iii) a connection between the aggregates and the fibrils, and wherein the insulating resin material has a micro network structure with a porosity of 50% or more.

In addition, according to a second embodiment of the present disclosure, there is provided a metal layer-equipped insulating resin material, including: the insulating resin material according to the first embodiment; and a metal layer on at least one surface of the insulating resin material. According to a third embodiment of the present disclosure, there is provided a wiring substrate, including the metal layer-equipped insulating resin material according to the second embodiment, wherein the metal layer of the metal layer-equipped insulating resin material is subjected to patterning treatment.

The metal layer is brought into close contact with the insulating resin material through intermediation of a fluorine-based resin layer.

The inventors have focused attention on the long-standing problem, i.e., that a low specific dielectric constant and a low linear thermal expansion coefficient are in a tradeoff relationship and it is difficult to achieve both a low specific dielectric constant and a low linear thermal expansion coefficient, and have made extensive research with the aim of achieving both a low specific dielectric constant and a low linear thermal expansion coefficient. As a result, the inventors have conceived of controlling the porosity of a material in an organic/inorganic composite technology. The inventors have made further investigations, and as a result, have found that, when an insulating resin material is increased in strength by firmly binding porous inorganic aggregates each having pores defined by a plurality of fine particles with fibrils each formed of polytetrafluoroethylene, both a low specific dielectric constant and a low linear thermal expansion coefficient, which are basically in a tradeoff relationship, can be achieved. Thus, the present disclosure has been achieved.

The insulating resin material of the present disclosure includes: porous inorganic aggregates each having pores defined by a plurality of fine particles; and fibrils each formed of polytetrafluoroethylene, wherein the fibrils are each multidirectionally oriented, wherein at least one of the porous inorganic aggregates and the fibrils are connected to each other, and wherein the insulating resin material is formed of a micro network structure having a porosity of 50% or more. Therefore, the insulating resin material can achieve both an excellent low specific dielectric constant and an excellent low linear thermal expansion coefficient.

Moreover, when the aggregates have a BET specific surface area of from 10 $m^2/g$ to 250 $m^2/g$, the micro network structure to be obtained becomes strong, and the insulating resin material to be obtained becomes excellent.

In addition, when the aggregates have an apparent specific gravity of 100 g/L or less, the micro network structure to be obtained becomes stronger.

Further, when the particles have an average particle diameter of from 5 nm to 35 nm, the micro network structure to be obtained becomes much stronger.

In addition, when the particles comprise a porous fine powder silica subjected to hydrophobic treatment, the specific dielectric constant and the loss tangent of the insulating resin material become stable, and the precision of a product to be obtained becomes excellent.

Further, when a blending amount of the aggregates is 50 wt. % or more with respect to a total weight of the aggregates and the fibrils, a lower linear thermal expansion coefficient is obtained, and the precision of the product to be obtained becomes excellent.

In addition, when the insulating resin material has a dielectric constant of from 1.55 to 1.9 and a loss tangent of 0.01 or less at a frequency of 10 GHz, the precision of the product to be obtained becomes excellent.

When the insulating resin material has a linear thermal expansion coefficient of from 10 ppm/K to 50 ppm/K, the precision of the product to be obtained becomes more excellent.

When the insulating resin material has a metal layer on at least one surface thereof, the metal layer-equipped insulating resin material serving as a substrate material excellent in low specific dielectric constant and low linear thermal expansion coefficient can be obtained.

In addition, when the metal layer is brought into close contact with the at least one surface of the insulating resin material through intermediation of the fluorine-based resin layer, the fluorine-based resin enters a roughened portion of the metal layer and a roughened portion and the pores of the insulating resin material, and exhibits an anchor effect. Thus, the metal layer and the insulating resin material can be firmly brought into close contact with each other.

Further, when the metal layer is brought into close contact with the at least one surface of the insulating resin material through intermediation of the fluorine-based resin layer at a peel strength of 0.6 kN/m or more, the metal layer-equipped insulating resin material having high reliability can be obtained.

When the metal layer of the metal layer-equipped insulating resin material is subjected to patterning treatment, the wiring substrate excellent in reliability can be obtained.

DESCRIPTION OF EMBODIMENTS

Embodiments of the present disclosure are hereinafter described in detail. The present disclosure is not limited to these embodiments.

Figure 1A:
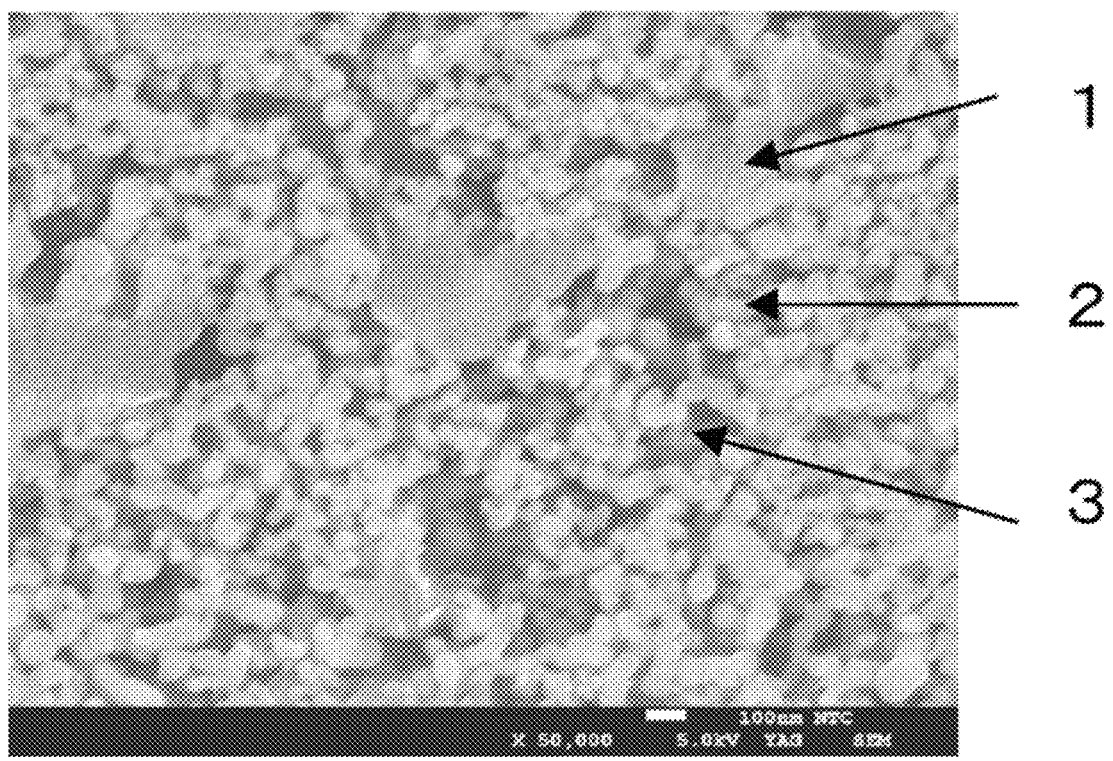
FIG. 1A is a scanning electron microscope (SEM) photograph (magnification: 50,000 times) in which a cross section of an insulating resin material according to an embodiment of the present disclosure in a thickness direction is enlarged.
Figure 1B:
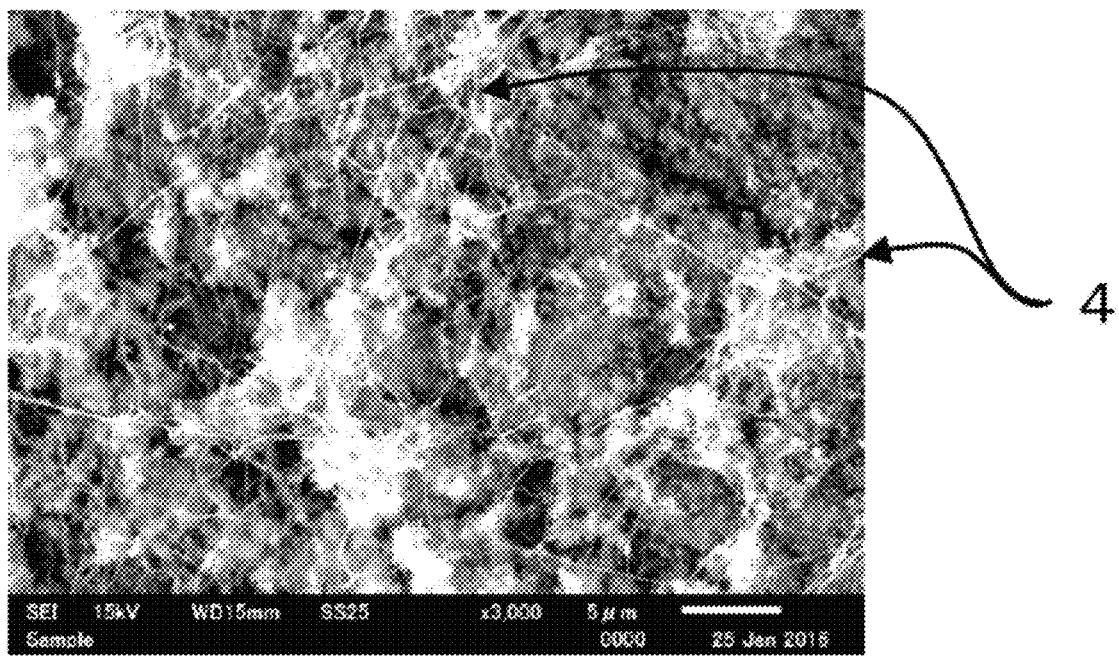
FIG. 1B is a SEM photograph (magnification: 3,000 times) in which a cross section thereof in a plane direction is enlarged.

As shown in SEM photographs of FIG. 1A and FIG. 1B, an insulating resin material of the present disclosure includes: porous inorganic aggregates 2 each having pores 3 defined by a plurality of fine particles; and fibrils 4 each formed of polytetrafluoroethylene. Moreover, in the insulating resin material, for example, as shown in the SEM photograph of FIG. 1B, the fibrils 4 are each multidirectionally oriented, and at least one of the porous inorganic aggregates 2 and the fibrils 4 are connected to each other. The insulating resin material is formed of a micro network structure having a porosity of 50% or more. In FIG. 1A, a cross section of the fibril is indicated by reference numeral 1.

Specifically, the porous inorganic aggregates 2 each having the pores 3 defined by the plurality of fine particles are firmly bound to each other with the fibrils 4 each formed of polytetrafluoroethylene, and thus the insulating resin material is formed of a micro network structure having a large number of pores. Now, the constituent elements are described one by one.

<Porous Inorganic Aggregate>

The porous inorganic aggregates to be used in the present disclosure are each formed of a plurality of fine particles. The form of each porous inorganic aggregate is as described below. The fine particles are primary particles, and the porous inorganic aggregate is present as an aggregate product in which a large number of such fine particles aggregate with each other. Specifically, the porous inorganic aggregate forms a bulky aggregate in which the plurality of fine particles aggregate with and fuse to each other in a bead form. With this, the porous inorganic aggregate serves as an aggregate having voids.

The fine particles serving as the primary particles have an average particle diameter of preferably from 5 nm to 35 nm, more preferably from 15 nm to 35 nm from the viewpoint of aggregability.

When the average particle diameter of the primary particles is lower than the above-mentioned lower limit value, a reduction in compression strength occurs, and hence there is a tendency that the particles are liable to collapse in a processing step. In addition, also spaces formed by the plurality of fine particles are reduced in size, and hence there is a tendency that a reduction in porosity of the insulating resin material is liable to occur.

Meanwhile, a porous inorganic aggregate formed of fine particles having an average particle diameter exceeding the above-mentioned upper limit value tends to form irregularities on a surface of the insulating resin material. There is a tendency that such porous inorganic aggregate is not suitable for a high-frequency insulating resin material requiring a smooth surf ace.

Herein, the average particle diameter was determined as described below. The diameters of a plurality of particles (100 particles) were determined through direct observation with a scanning electron microscope (SEM) or the like, and an average value thereof was used as the average particle diameter.

Based on the degree of aggregation of the primary particles, the aggregate is classified into a primary aggregate and a secondary aggregate. The secondary aggregate refers to a conglomerate in which the primary aggregates further aggregate with each other. The primary aggregate generally has a size of from 100 nm to 400 nm, and the secondary aggregate generally has a size of from 1 µm to 100 µm.

The porous inorganic aggregates included in the insulating resin material are each preferably a secondary aggregate from the viewpoint that a three-dimensional micro network structure of the fine particles is easily formed.

Herein, the "pores" defined by the plurality of fine particles in each of the porous inorganic aggregates mean voids in the bulky aggregate in which the plurality of fine particles aggregate with and fuse to each other in a bead form. The shapes of the pores may each be a spherical shape or an irregular shape, and are not particularly limited. In addition, the pores are preferably defined by fine particles having uniform particle diameters in terms of ease of maintenance of the pores.

The average pore diameter of the pores is preferably from 10 nm to 1,000 nm, and is more preferably from 50 nm to 500 nm from the viewpoint of keeping the mechanical characteristics of the insulating resin material from lowering.

The average pore diameter is determined as follows: the pore diameters of a plurality of pores (100 pores) are determined by direct observation with a scanning electron microscope (SEM) or the like, and the average value thereof is adopted as the average pore diameter. In the case of irregular pores, the maximum diameter of each pore is used as its pore diameter.

In addition, the BET specific surface area of each of the porous inorganic aggregates is preferably from 10 $m^2/g$ to 250 $m^2/g$ from the viewpoint that the bulky aggregate is easily formed. Further, the BET specific surface area of each of the porous inorganic aggregates is particularly preferably from 40 $m^2/g$ to 100 $m^2/g$. When the BET specific surface area of each of the porous inorganic aggregates is less than the above-mentioned lower limit value, each of the porous inorganic aggregates serves as aggregate particles close to the primary particles, and the spaces formed by the plurality of fine particles are reduced, and hence there is a tendency that a reduction in porosity of the insulating resin material is liable to occur. Meanwhile, when the BET specific surface area of each of the porous inorganic aggregates exceeds the above-mentioned upper limit value, the number of polar functional groups, such as OH groups, on a surface of each of the porous inorganic aggregates is increased, and hence a contaminant, such as water, adheres thereto. As a result, there is a tendency that dielectric characteristics are liable to be reduced owing to increases in specific dielectric constant and loss tangent. In addition, the porous inorganic aggregates cannot be firmly bound to each other with the fibrils each formed of polytetrafluoroethylene, and there is a tendency that cracks are liable to occur in the insulating resin material to be obtained.

The specific surface area of each of the porous inorganic aggregates is based on a BET method (a volumetric method at a constant pressure by gas adsorption using a nitrogen gas).

Further, the apparent specific gravity of each of the porous inorganic aggregates is preferably 100 g/L or less from the viewpoint of porosity. The apparent specific gravity of each of the porous inorganic aggregates is more preferably from 30 g/L to 100 g/L, particularly preferably from 50 g/L to 60 g/L.

When the apparent specific gravity of each of the porous inorganic aggregates exceeds the above-mentioned upper limit value, each of the porous inorganic aggregates serves as a primary particle having a high aggregation density or aggregate particles close to the primary particles, and the porosity of each of the porous inorganic aggregates in itself is reduced. As a result, the porosity of the insulating resin material is reduced, and there is a tendency that the insulating resin material cannot be imparted with a desired low dielectric constant.

Meanwhile, when the apparent specific gravity of each of the porous inorganic aggregates is less than the above-mentioned lower limit value, the porosity of each of the porous inorganic aggregates in itself is increased, but contact points between the primary particles are reduced, and there is a tendency that a reduction in compression strength occurs. When a reduction in compression strength occurs, the particles of each of the porous inorganic aggregates are liable to collapse, and satisfactory processability cannot be obtained.

The apparent specific gravity of each of the porous inorganic aggregates was determined as described below. A predetermined amount of silica fine powder was loaded slowly into a measuring cylinder (volume: 250 mL) and a weight thereof was measured. The measured value was defined as X g. After loading silica and allowing the silica to stand still, a volume of the silica was read off, and the read value was defined as Y mL. The apparent specific gravity was determined by the equation: apparent specific gravity (g/L)=X/Y×1,000.

When the average particle diameter of the primary particles, the BET specific surface area, and the apparent specific gravity fall within the preferred ranges, an insulating resin material additionally excellent in low specific dielectric constant and low linear thermal expansion coefficient can be obtained.

The fine particles constituting each of the porous inorganic aggregates are each formed of, for example, porous fine powder silica subjected to hydrophobic treatment, titanium oxide, or alumina. Of those, it is preferred to use porous fine powder silica subjected to hydrophobic treatment from the viewpoint of the low specific dielectric constant and the low linear thermal expansion coefficient.

The fine particles constituting each of the porous inorganic aggregates may be used alone or in combination thereof.

The porous fine powder silica is hydrophobized by, for example, a method involving treating the porous fine powder silica with a surface treatment agent, such as dimethyldichlorosilane, hexamethyldisilazane, a silicone oil, or octylsilane.

The hydrophobic degree of the porous fine powder silica may be examined by a powder wettability test using a methanol aqueous solution. While particles formed of porous fine powder silica have a high hydrophilic degree and wet with water and settle therein, particles formed of the porous fine powder silica subjected to hydrophobic treatment do not settle in water, and wet with methanol and settle therein. The powder wettability test is a method involving, through utilization of the above-mentioned characteristics, allowing particles formed of porous fine powder silica having a high hydrophobic degree to wet with a methanol aqueous solution and settle therein by changing the methanol concentration of the methanol aqueous solution, and measuring the volume of the particles.

For complete settlement of the porous fine powder silica subjected to hydrophobic treatment to be used in the present disclosure, a methanol concentration of 30 wt. % or more is required in the powder wettability test described above.

Examples of the porous fine powder silica subjected to hydrophobic treatment include amorphous silica, precipitated silica, pyrogenic silica, fumed silica, and a silica gel. Of those, it is preferred to use fumed silica from the viewpoint of the low specific dielectric constant and the low linear thermal expansion coefficient. The silicas may be used alone or in combination thereof.

In addition, a commercially available product may be used as the porous fine powder silica subjected to hydrophobic treatment. Specifically, there are given Mizukasil series (manufactured by Mizusawa Industrial Chemicals, Ltd.), Sylysia series (manufactured by Fuji Silysia Chemical, Ltd.), hydrophobic Aerosil series (manufactured by Nippon Aerosil Co., Ltd.), and Nipsil series (manufactured by Tosoh Silica Corporation). Of those, the porous fine powder silica is preferably hydrophobic fumed silica in the hydrophobic Aerosil series (manufactured by Nippon Aerosil Co., Ltd.).

<Fibril>

The insulating resin material of the present disclosure includes the fibrils each formed of polytetrafluoroethylene in addition to the porous inorganic aggregates described above.

As polytetrafluoroethylene for forming each of the fibrils, it is preferred to use polytetrafluoroethylene particles at a stage of a resin composition before production of the insulating resin material from the viewpoint of fibrillation.

The average particle diameter of the polytetrafluoroethylene particles is preferably larger than the average particle diameter of the primary particles of each of the porous inorganic aggregates in order to easily promote the fibrillation. Meanwhile, an aggregate of the polytetrafluoroethylene particles preferably has a particle diameter of 650 µm or less from the viewpoint of dispersibility.

The fibrillation of the polytetrafluoroethylene particles is affected by some factors, such as the magnitude of a shear force to be applied, a temperature, and the presence of an arbitrary lubricating fluid between the primary particles, but the fibrils are each preferably formed through a multi-stage roll-forming step described later from the viewpoint of promotion of fibrillation. When the degree of fibrillation of the polytetrafluoroethylene particles is high, an insulating resin material formed of a structure having high mechanical strength is obtained.

As shown in FIG. 1B, the fibrils included in the insulating resin material of the present disclosure are each multidirectionally oriented. As compared to a resin material in which fibrils are each oriented in a single direction, a resin material in which fibrils are each multidirectionally oriented has formed therein a three-dimensional network structure by the fibrils, and provides an insulating resin material having higher mechanical strength.

In addition, at least one of the porous inorganic aggregates and the multidirectionally oriented fibrils are connected to each other to form a micro network structure. As a combination to be connected, there are given a combination of the porous inorganic aggregates, a combination of the fibrils, and a combination of the porous inorganic aggregates and the fibrils. Of those, a case in which a three-dimensional network structure formed by the porous inorganic aggregates and a three-dimensional network structure formed by the fibrils are connected to each other is preferred because the network structures tangle with each other to extend in every direction, resulting in a synergistic contribution to increase strength and porosity of the insulating resin material.

The blending amount of the porous inorganic aggregates is preferably 50 wt. % or more, more preferably from 50 wt. % to 75 wt. %, particularly preferably from 55 wt. % to 70 wt. % with respect to 100 wt. % of the total of polytetrafluoroethylene serving as a constituent component of each of the fibrils and the porous inorganic aggregates.

When the blending amount is less than the above-mentioned lower limit value, there is a tendency that the linear thermal expansion coefficient exceeds 50 ppm/K. Meanwhile, when the blending amount exceeds the above-mentioned upper limit value, there is a tendency that an effect exhibited by the binding of polytetrafluoroethylene and the porous inorganic aggregates is reduced, and formability is reduced.

The specific dielectric constant and the linear thermal expansion coefficient may be adjusted by a blending ratio between the porous inorganic aggregates and polytetrafluoroethylene.

The degree of mutual connection of the at least one of the porous inorganic aggregates and the fibrils varies depending on the amount of the fibrils, the magnitude of the shear force to be applied, or the like.

When the blending amount of polytetrafluoroethylene serving as a constituent component of each of the fibrils is increased, the fibrils are generated in a larger amount.

<Others>

The insulating resin material of the present disclosure may include additional material components as required. In order to improve thermal conduction characteristics and dielectric characteristics, a thermal conductive material having a low specific dielectric constant, such as boron nitride, may be added. Further, for example, in order to increase mechanical strength, a polymer for binding the porous inorganic aggregates may be added as required.

Those additional material components may be used alone or in combination thereof.

In order to form the insulating resin material of the present disclosure, the additional material components may be added within a range in which the specific dielectric constant of the insulating resin material does not exceed 1.9.

<Method of Producing Insulating Resin Material>

Next, a preferred example of a method of producing the insulating resin material of the present disclosure is described.

For example, the method of producing the insulating resin material of the present disclosure includes:

(I) a step of mixing porous inorganic aggregates and polytetrafluoroethylene in the presence of a solvent and drying the mixture to obtain mixed powder, followed by adding and mixing a volatile additive in the mixed powder to prepare a paste;

(II) a step of forming resin composition sheets through use of the paste;

(III) a step of superimposing the resin composition sheets on each other and subjecting the sheets to multi-stage roll-forming to obtain a rolled lamination sheet;

(IV) a step of removing the volatile additive; and (V) a step of subjecting the lamination sheet to heat and pressure forming for imparting higher strength.

With this, there is obtained an insulating resin material having a micro network structure as shown in FIG. 1A in which a structure in which the porous inorganic aggregates and the fibrils each formed of polytetrafluoroethylene are firmly bound to each other is achieved and a plurality of pores are formed.

In the preparation of the paste in the step (I), the porous inorganic aggregates and polytetrafluoroethylene are mixed with each other in the presence of a solvent, and the mixture is dried. Thus, mixed powder is prepared. Examples of the solvent to be used herein include water and lower alcohols, such as methanol, ethanol, isopropanol, and butanol. Those solvents may be used alone or in combination thereof.

In addition, at the time of the mixing, it is preferred to use a polytetrafluoroethylene dispersion from the viewpoint of dispersibility. The drying is performed through use of known means, such as a drying furnace.

The "adding and mixing a volatile additive in the mixed powder to prepare a paste" is meant to include not only a case in which the paste is formed only of porous inorganic fine powder, polytetrafluoroethylene, and the volatile additive but also a case in which the paste is obtained by combining the porous inorganic aggregates, polytetrafluoroethylene, and the volatile additive, and any other auxiliary component.

The volatile additive is preferably a liquid having a boiling point of 300° C. or less, and examples thereof include polyethylene glycol, an ester, an isoparaffin-based hydrocarbon, and low-molecular-weight hydrocarbons, such as hexane and dodecane. Of those, low-molecular-weight hydrocarbons are preferably used. Those volatile additives may be used alone or in combination thereof.

Next, in the step (II), a plurality of resin composition sheets are produced through use of the paste. In the step (III), the plurality of resin composition sheets produced are superimposed on one another and subjected to multi-stage roll-forming. Thus, a rolled lamination sheet is produced.

In the step (II), at the time of forming of the resin composition sheets, for example, forming through use of a forming machine, such as an FT die, a press machine, an extrusion molding machine, or a calendar roll, is adopted. Of those, forming through use of a FT die is particularly preferred.

Now, the "multi-stage roll-forming" in the step (III) is specifically described.

A plurality of (e.g., 2 to 10) resin composition sheets are laminated on one another, and the resultant laminated product is rolled to provide a first rolled lamination sheet. The two resultant first rolled lamination sheets are superimposed and laminated on each other, and the resultant laminated product is rolled to produce a second rolled lamination sheet. Further, the two resultant second rolled lamination sheets are superimposed and laminated on each other, and the resultant laminated product is rolled to produce a third rolled lamination sheet. As described above, the lamination and rolling step is repeated until an intended number of constituent layers of the insulating resin material is achieved. The "multi-stage roll-forming" refers to repeating the lamination and rolling step.

At the time of production of the rolled lamination sheet, for example, forming through use of a forming machine, such as a press machine, an extrusion molding machine, or a calendar roll, is adopted. Of those, forming through use of a calendar roll is preferred from the viewpoint of productivity.

As the number of constituent layers is increased more through the multi-stage roll-forming, the strength of the insulating resin material to be obtained can be increased more. The number of constituent layers is preferably from 10 to 1,000.

In addition, in the rolling, a rolling ratio is preferably from 100 times to 20,000 times from the viewpoint of forming the fibrils in a larger amount.

When the lamination and rolling step is repeated, it is desired to change a rolling direction. As a method of changing the rolling direction, there is given, for example: a method involving rolling a plurality of sheets while the rolling directions thereof are aligned with one another to produce a plurality of rolled lamination sheets, followed by: (1) rolling the resultant plurality of rolled lamination sheets by rotating the resultant plurality of rolled lamination sheets 90 degrees with respect to the previous rolling direction while the rolling directions of the resultant plurality of rolled lamination sheets are aligned with one another and the surfaces of the sheets are kept parallel; (2) rolling the resultant plurality of rolled lamination sheets by rotating part of the resultant plurality of rolled lamination sheets 90 degrees with respect to the previous rolling direction while the surface of the part of the resultant plurality of rolled lamination sheets is kept parallel; or (3) rolling the resultant plurality of rolled lamination sheets by arranging part of the resultant plurality of rolled lamination sheets in a form of being folded 180 degrees and rotating the part of the resultant plurality of rolled lamination sheets 90 degrees. When the rolling is performed by changing the rolling direction as described above, a network formed by polytetrafluoroethylene extends in every direction, and the fibrils having the three-dimensional network structure are formed.

Through the multi-stage rolling described above, a formed body having a finally intended thickness (e.g., a thickness of from about 0.1 mm to about 2 mm) is produced. After that, the volatile additive is removed in the step (IV).

The removal of the volatile additive in the step (IV) may be performed in accordance with a method appropriately selected from known methods depending on the volatile additive to be used. Out of such known methods, a method involving loading the rolled lamination sheet into a drying furnace or the like and heating the rolled lamination sheet to volatilize the volatile additive is preferred.

In the heat and pressure forming in the step (V), the rolled lamination sheet is preferably sintered at a temperature in a firing temperature range of polytetrafluoroethylene (e.g., from 300° C. to 500° C.). In addition, the heat and pressure forming is preferably performed through use of a press machine from the viewpoint of formability.

When the heat and pressure forming in the step (V) is performed in a range in which the porosity of the insulating resin material is not reduced to less than 50% (e.g., at from 40° C. to 500° C. and from 0.2 MPa to 30 MPa for 5 minutes to 60 minutes), porous fine powder and polytetrafluoroethylene can be bound to each other more firmly.

Figure 2:
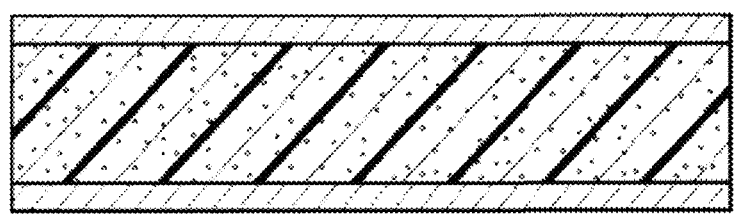
FIG. 2 is a sectional view of a metal layer-equipped insulating resin material according to an embodiment of the present disclosure.

In addition, when a metal layer-equipped insulating resin material is produced, (VI) a step of forming a metal layer on at least one surface of the insulating resin material obtained through the above-mentioned steps (I) to (V) is included (see FIG. 2, metal layers are formed on both an upper surface and a lower surface of the insulating resin material in FIG. 2).

Figure 3:
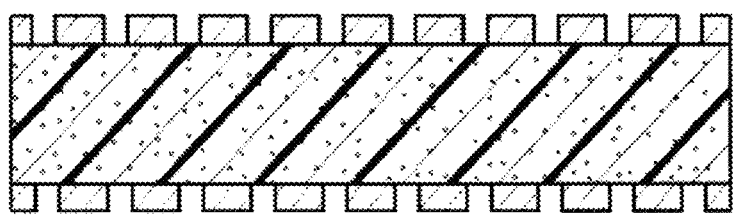
FIG. 3 is a sectional view of a wiring substrate according to an embodiment of the present disclosure.

Further, when a wiring substrate is produced, (VII) a step of subjecting the metal layer of the metal layer-equipped insulating resin material to patterning treatment is included (see FIG. 3).

As the step of forming a metal layer on at least one surface of the insulating resin material serving as the step (VI), there are given, for example: a method involving bringing a metal layer into close contact with the insulating resin material through intermediation of a resin layer for c lose contact which can be softened and melted by heat, such as a thermoplastic resin; a method involving bonding a metal foil, such as a copper foil; a lamination method; and a sputtering or plating method involving using a metal substance. Of those, it is preferred to use a method involving bringing a metal layer into close contact with the insulating resin material through intermediation of a resin layer for close contact from the viewpoint of an adhesive property, and a lamination method from the viewpoint of forming a metal layer having a uniform thickness.

As the method of bringing a metal layer into close contact with the insulating resin material through intermediation of a resin layer for close contact, there is given a method involving, before bonding, forming a resin layer for close contact between a metal layer and the insulating resin material, and then, melting the resin layer for close contact with heat and pressure through heat press or the like to allow a resin to enter a roughened portion of the metal layer and a roughened portion and a pore portion of the insulating resin material, to thereby realize firm adhesion by virtue of an anchor effect. As the resin of the resin layer for close contact, any resin which is softened and melted with heat at the time of bonding with a metal can realize the adhesion, but from the viewpoint of the dielectric characteristics, a fluorine-based resin material is preferred. Herein, the fluorine-based resin is not particularly limited as long as the resin is a fluorine-based resin, and examples thereof include polytetrafluoroethylene (PTFE), a tetrafluoroethylene-perfluoroalkyl vinyl ether copolymer (PFA), a tetrafluoroethylene-hexafluoropropylene copolymer (FEP), a tetrafluoroethylene-ethylene copolymer (ETFE), and polychlorotrifluoroethylene (PCTFE). Of those, PTFE and PFA are more preferred.

When the metal layer and the insulating resin material are brought into close contact with each other through intermediation of a fluorine-based resin layer, a peel strength of 0.6 kN/m or more is preferably exhibited from the viewpoint of reliability.

As a method of allowing the resin layer for close contact to intermediate therebetween, any one of: a method involving application onto the roughened portion of the metal layer and drying, to prepare the resin layer for close contact; a method involving dipping of or application onto the insulating resin material, followed by drying, to prepare the resin layer for close contact; a method involving placing a hot melt film between the metal layer and the insulating resin material; and the like is adopted. In addition, the resin layer for close contact is preferably formed into a thickness of 10 µm or less in consideration of the dielectric characteristics, thermal expansion, and the like.

Examples of the metal of the metal layer include gold, silver, platinum, copper, aluminum, and alloys thereof. Of those, copper is preferably used. The thickness of the metal layer is preferably from 5 µm to 50 µm.

When the insulating resin material is a sheet-like product, the metal layer may be arranged on one surface or each of both surfaces of the sheet. As a method for the patterning treatment for forming wiring in the step (VII), there are given an additive method involving using a photoresist or the like and a subtractive method based on etching.

The insulating resin material of the present disclosure may be obtained as described above. However, the method of manufacturing the insulating resin material is not limited to the foregoing.

The insulating resin material obtained as described above is formed of a micro network structure in which at least one of the porous inorganic aggregates and the fibrils are connected to each other and which has a porosity of 50% or more.

The obtained insulating resin material achieves both a satisfactory low specific dielectric constant and a satisfactory low linear thermal expansion coefficient.

Specifically, the insulating resin material has a specific dielectric constant at a frequency of 10 GHz of preferably from 1.55 to 1.9, more preferably from 1.55 to 1.8 from the viewpoint of the precision of a product to be obtained. The specific dielectric constant is determined by a cavity resonator perturbation method at a measurement frequency of 10 GHz.

Further, the insulating resin material has a loss tangent of preferably 0.01 or less from the same viewpoint. The loss tangent is determined by the cavity resonator perturbation method at a measurement frequency of 10 GHz.

The insulating resin material has a linear thermal expansion coefficient of preferably from 10 ppm/K to 50 ppm/K from the viewpoint of the reliability of the product to be obtained. The linear thermal expansion coefficient is determined by a thermal mechanical analysis (TMA) method in which an average linear thermal expansion coefficient in a range of from 30° C. to 100° C. is used as the linear thermal expansion coefficient.

The insulating resin material of the present disclosure achieves both a satisfactory low specific dielectric constant and a satisfactory low linear thermal expansion coefficient, and hence a metal layer-equipped insulating resin material including the insulating resin material and a metal layer arranged on at least one surface thereof serves as a substrate material excellent in low specific dielectric constant and low linear thermal expansion coefficient.

In addition, a wiring substrate including the metal layer-equipped insulating resin material, in which the metal layer thereof is subjected to patterning treatment, has good precision and is excellent in reliability. Accordingly, the wiring substrate can be suitably used for a module of a mobile phone, a computer, an antenna, or the like. In addition, the wiring substrate has a low specific dielectric constant and also has little variation in specific dielectric constant. Accordingly, a detection distance is extended and precision can be improved, and hence the wiring substrate is suitably used for a wiring substrate for high frequency applications included in a millimeter-wave antenna.

EXAMPLES

Next, the insulating resin material of the present disclosure is specifically described by way of Examples, but the present disclosure is not limited to these Examples.

Example 1

Hydrophobic fumed silica (manufactured by Nippon Aerosil Co., Ltd., product number: "NY50", BET specific surface area: 40 m²/g, apparent specific gravity: 60 g/L, average particle diameter of primary particles: 30 nm) and Fluon (trademark) PTFE dispersion AD939E (manufactured by Asahi Glass Co., Ltd., solid content: 60 wt. %) were prepared as fine particles constituting each of porous inorganic aggregates and polytetrafluoroethylene (PTFE), respectively. In consideration of a sol id content amount, the porous inorganic aggregates and polytetrafluoroethylene were mixed at a ratio (weight ratio) of 60:40 in a 60% methanol aqueous solution to produce an aggregate product. The resultant aggregate product was dried, and thus mixed powder was obtained.

Dodecane serving as a volatile additive was added to the mixed powder so that the amount of dodecane was 50 wt. % with respect to the entirety, and mixed therewith with a V-type mixer serving as a mixing device at a rotation number of 10 rpm and a temperature of 24° C. for a mixing time period of 5 minutes. The resultant mixed paste was passed through a pair of rolling rolls to provide an elliptic base sheet (formed body in a sheet form) having a thickness of 3 mm, a width of from 10 mm to 50 mm, and a length of 150 mm. A plurality of the base sheets were produced.

Next, the two base sheets were laminated on each other, and the resultant laminate was rolled by being passed through the rolling rolls to produce a first rolled lamination sheet. A plurality of the first rolled lamination sheets were produced.

Next, the two first rolled lamination sheets were superimposed on each other while the rolling directions of the sheets were aligned with each other, and the sheets were rolled by rotating the sheets 90 degrees with respect to the previous rolling direction while the surfaces of the sheets were kept parallel. Thus, a second rolled lamination sheet was produced. A plurality of the second rolled lamination sheets were produced.

Further, the two second rolled lamination sheets were superimposed and laminated on each other to produce a third rolled lamination sheet.

A sheet lamination and rolling step as described above was repeated a total of 5 times when it was counted from the lamination and rolling of the base sheets. After that, the resultant lamination sheet was rolled a plurality of times while a gap between the rolling rolls was reduced by 0.5 mm. Thus, a sheet having a thickness of about 0.18 m was obtained (number of constituent layers: 32).

Next, the resultant rolled lamination sheet was heated at 150° C. for 30 minutes to remove the volatile additive. Thus, a sheet was produced.

The resultant sheet was subjected to pressure forming at 4 MPa at 380° C. for 5 minutes. Thus, an insulating resin material of Example 1 was obtained. Finally, a sheet having a thickness of about 0.15 mm was obtained.

The insulating resin material produced as described above was measured for a weight and a volume, and a porosity was calculated based on the specific gravity and blending ratio of each component.

Example 2

An insulating resin material was produced by the same procedure as in Example 1 except that hydrophobic fumed silica (manufactured by Nippon Aerosil Co., Ltd., product number: "NAX50", BET specific surface area: 50 m²/g, apparent specific gravity: 60 g/L, average particle diameter of primary particles: 30 nm) was used as fine particles constituting each of porous inorganic aggregates.

Example 3

An insulating resin material was produced by the same procedure as in Example 1 except that hydrophobic fumed silica (manufactured by Nippon Aerosil Co., Ltd., product number: "RY200S", BET specific surface area: 95 m²/g, apparent specific gravity: 50 g/L, average particle diameter of primary particles: 16 nm) was used as fine particles constituting each of porous inorganic aggregates.

Example 4

An insulating resin material was produced by the same procedure as in Example 1 except that the same porous inorganic aggregates as in Example 1 were used and the porous inorganic aggregates and polytetrafluoroethylene were blended at a ratio of 70:30 in terms of a weight ratio.

Example 5

An insulating resin material was produced by the same procedure as in Example 1 except that hydrophobic fumed silica (manufactured by Nippon Aerosil Co., Ltd., product number: "RX200", BET specific surface area: 165 m²/g, apparent specific gravity: 50 g/L, average particle diameter of primary particles: 12 nm) was used as porous inorganic aggregates, the porous inorganic aggregates and polytetrafluoroethylene were blended at a ratio of 50:50 in terms of a weight ratio, and dodecane serving as a volatile additive was added in an amount of 45 wt. % with respect to the entirety.

Example 6

An insulating resin material was produced by the same procedure as in Example 1 except that hydrophobic fumed silica (manufactured by Nippon Aerosil Co., Ltd., product number: "RX300", BET specific surface area: 230 m²/g, apparent specific gravity: 50 g/L, average particle diameter of primary particles: 7 nm) was used as porous inorganic aggregates, the porous inorganic aggregates and polytetrafluoroethylene were blended at a ratio of 50:50 in terms of a weight ratio, and dodecane serving as a volatile additive was added in an amount of 50 wt. % with respect to the entirety.

Comparative Example 1

An insulating resin material was produced by the same procedure as in Example 1 except that hydrophobic fumed silica (manufactured by Nippon Aerosil Co., Ltd., product number: "RX50", BET specific surface area: 45 m²/g, apparent specific gravity: 170 g/L, average particle diameter of primary particles: 40 nm) was used as fine particles constituting each of porous inorganic aggregates.

Comparative Example 2

An insulating resin material was produced by the same procedure as in Example 1 except that hollow inorganic particles were used instead of the fine particles constituting each of porous inorganic aggregates, the hollow inorganic particles and polytetrafluoroethylene were mixed at a ratio (weight ratio) of 35:65 in methanol through use of "Glass Bubbles iM16K" (true density: 0.46 g/cm³, particle diameter: 20 μm) manufactured by 3M subjected to hydrophobic treatment with a silicone oil to produce an aggregate product, the resultant aggregate product was dried to produce mixed powder, and dodecane serving as a volatile additive was added in an amount of 40 wt. % with respect to the entirety.

With the use of each sheet thus obtained, characteristic evaluations were performed in accordance with methods to be described below. The results of the evaluations are collectively shown in Table 1 below.

<Specific Dielectric Constant and Loss Tangent>

A complex dielectric constant was measured by a cavity resonator perturbation method at a measurement frequency of 10 GHz, and its real part ($\varepsilon r'$) was adopted as a specific dielectric constant. In addition, a loss tangent was determined from a ratio of an imaginary part ($\varepsilon r''$) to the real part, ($\varepsilon r''/\varepsilon r'$).

With the use of a specific dielectric constant-measuring apparatus ("Network Analyzer N5230C" manufactured by Agilent Technologies, and "Cavity Resonator 10 GHz" manufactured by Kanto Electronic Application and Development Inc.), a strip-shaped sample (sample size: 2 mm in width×70 mm in length) was cut out of each sheet and subjected to the measurement.

<Linear Thermal Expansion Coefficient>

An average linear thermal expansion coefficient in a sheet plane direction in the range of from 30° C. to 100° C. was determined as a linear thermal expansion coefficient (ppm/K) by a TMA method with a thermal mechanical analyzer (manufactured by BRUKER AXS, "TMA4000SA").

<Water Absorption Rate>

The resultant insulating resin material (sample size: 50 mm in width×50 mm in length) was dried at 130° C. for 30 minutes, and then a weight thereof before a test was measured. The insulating resin material was immersed in distilled water at 23° C. for 24 hours, and then a weight thereof was measured. Thus, a saturated water absorption rate was determined.

From the results shown in Table 1 below, it is revealed that the insulating resin materials of Examples 1 to 6 are each a material achieving both a satisfactory low specific dielectric constant and a satisfactory low linear thermal expansion coefficient.

Meanwhile, in the case of the product of Comparative Example 1, the result was that a micro network structure having a sufficient porosity was not obtained and the specific dielectric constant was high.

In the case of the product of Comparative Example 2, the result was that the porosity was below 50% because the hollow inorganic particles were pulverized, and the linear thermal expansion coefficient was poor.

In addition, the result was that also the water absorption rate of the insulating resin material was increased.

When the products of Examples 1 to 6 and the product of Comparative Example 2 were compared, it was revealed that the insulating resin materials of the present disclosure each had a low water absorption rate despite that a micro network structure was formed, and hence stable dielectric characteristics were able to be maintained even in a hygroscopic environment.

Next, a metal layer-equipped insulating resin material (substrate) was produced by forming copper foils (Cu layers) on both surfaces of each of the insulating resin materials which were the products of Examples and the products of Comparative Examples obtained above. After that, the copper foils were subjected to etching treatment. Thus, a wiring substrate was obtained. The metal layer-equipped insulating resin material was obtained as a double side copper-bonded sheet material by forming a resin layer for close contact shown in Table 1 below between each of metal layers and the insulating resin material (in Comparative Examples 1 and 2, the resin layer for close contact was not present), and subjecting the resultant lamination sheet to pressure forming, to thereby bond each of the metal layers to the insulating resin material.

Through use of the metal layer-equipped insulating resin materials obtained as described above, characteristic evaluation was performed by the following method. The results were also shown in Table 1 below.

<Peel Strength of Metal Layer>

The metal layer-equipped insulating resin materials after production were each tested in accordance with JIS C6481 standard. A test piece having a length of about 100 mm in a state in which a metal layer having a width of 10 mm was laminated was produced. A metal layer portion was peeled off therefrom in a direction at an angle of 90° at a rate of 50 mm/min, and a peel strength was determined. At this time, as a fracture mode, whether delamination (interfacial fracture) between the metal layer and the insulating resin layer occurred, or fracture of a base material (base material fracture) occurred first and the metal layer and the insulating resin layer were brought into close contact with each other at a strength of 0.6 kN/m or more was confirmed.

TABLE 1

| | | | Example 1 | Example 2 | Example 3 | Example 4 | Example 5 | Example 6 | Comparative Example 1 | Comparative Example 2 |
|---|---|---|---|---|---|---|---|---|---|---|
| Insulating resin material | Fine particles | Product number | NY50 | NAX50 | RY200S | NAX50 | RX200 | RX300 | RX50 | Porous iM16K |
| | | BET specific surface area (m²/g) | 40 | 50 | 95 | 50 | 165 | 230 | 45 | — |
| | | Apparent specific gravity (g/L) | 60 | 60 | 50 | 60 | 50 | 50 | 170 | 270 |
| | | Average primary particle diameter (nm) | 30 | 30 | 16 | 30 | 12 | 7 | 40 | — |
| | Formulation (parts) | Fine particle | 60 | 60 | 60 | 70 | 50 | 50 | 60 | 35 |
| | | PTFE | 40 | 40 | 40 | 30 | 50 | 50 | 40 | 65 |
| | | Volatile additive | 50 | 50 | 50 | 50 | 45 | 45 | 50 | 40 |
| | Characteristics | Porosity (%) | 57 | 61 | 57 | 59 | 59 | 63 | 48 | 43 |
| | | Specific dielectric constant | 1.75 | 1.68 | 1.77 | 1.57 | 1.6 | 1.55 | 1.93 | 1.85 |
| | | Loss tangent | 0.0018 | 0.9011 | 0.0036 | 0.001 | 0.005 | 0.007 | 0.0023 | 0.017 |

TABLE 1-continued

| | | | Example 1 | Example 2 | Example 3 | Example 4 | Example 5 | Example 6 | Comparative Example 1 | Comparative Example 2 |
|---|---|---|---|---|---|---|---|---|---|---|
| | Linear thermal expansion coefficient (ppm/K) | | 31 | 25 | 38 | 22 | 40 | 35 | 27 | 49 |
| | Water absorption rate % | | 0.02 | 0.01 | 0.03 | 0.01 | 0.02 | 0.02 | 0.02 | 3.6 |
| Metal layer-equipped insulating resin material | Resin layer for close contact | Kind | PFA | PTFE | PFA | PTFE | PFA | PTFE | Absent | Absent |
| | | Thickness (μm) | 2 | 2 | 6 | 10 | 10 | 2 | — | — |
| | Peel strength of metal layer (kN/m) | | >0.75 | >0.75 | >0.75 | >0.75 | >0.75 | >0.75 | 0.1 | 0.1 |
| | Fracture mode | | Base material fracture | Base material fracture | Base material fracture | Base material fracture | Base material fracture | Base material fracture | Interfacial fracture | Interfacial fracture |

From the results shown in Table 1 above, it is revealed that, in each of the metal layer-equipped insulating resin materials which are the products of Examples, the metal layer is formed on the insulating resin material with excellent adhesion strength (peel strength). Moreover, the copper foils of each of the obtained metal layer-equipped insulating resin materials (substrates) which were the products of Examples were subjected to etching treatment to provide the wiring substrate. The wiring substrate uses the insulating resin material achieving both a satisfactory low specific dielectric constant and a satisfactory low linear thermal expansion coefficient, and hence is excellent in reliability. When the wiring substrate was used for a millimeter-wave antenna for a vehicle, the following results were obtained: deviation of the position of wiring did not occur and a detection distance was extended.

Although specific modes of the present disclosure have been described in Examples above, Examples are for illustrative purposes only and are not to be construed as limitative. It is intended that various modifications apparent to a person skilled in the art fall within the scope of the present disclosure.

The insulating resin material of the present disclosure has both an excellent low specific dielectric constant and an excellent low linear thermal expansion coefficient, and hence is suitable as a wiring substrate material for high frequency applications and can be suitably utilized for a millimeter-wave antenna for a vehicle.

REFERENCE SIGNS LIST 1 fibril cross section
2 porous inorganic aggregate
3 pore
4 fibril

The invention claimed is:

1. An insulating resin material, comprising:
porous inorganic aggregates each having pores, the aggregates each comprising a plurality of fine particles; and
fibrils comprising a fibril made from polytetrafluoroethylene,
wherein each fibril of the fibrils is multidirectionally oriented,
wherein the insulating resin material has at least one connection selected from the group consisting of (i) a connection among the aggregates; (ii) a connection among the fibrils; and (iii) a connection between the aggregates and the fibrils, and
wherein the insulating resin material has a micro network structure with a porosity of 50% or more.

2. The insulating resin material according to claim 1, wherein the aggregates have a BET specific surface area of from 10 m$^2$/g to 250 m$^2$/g.

3. The insulating resin material according to claim 1, wherein the aggregates have an apparent specific gravity of 100 g/L or less.

4. The insulating resin material according to claim 1, wherein the particles have an average particle diameter of from 5 nm to 35 nm.

5. The insulating resin material according to claim 1, wherein the particles comprise a porous fine powder silica subjected to hydrophobic treatment.

6. The insulating resin material according to claim 1, wherein a blending amount of the aggregates is 50 wt. % or more with respect to a total weight of the aggregates and the fibrils.

7. The insulating resin material according to claim 1, wherein the insulating resin material has a dielectric constant of from 1.55 to 1.9 and a loss tangent of 0.01 or less at a frequency of 10 GHz.

8. The insulating resin material according to claim 1, wherein the insulating resin material has a linear thermal expansion coefficient of from 10 ppm/K to 50 ppm/K.

9. A metal layer-equipped insulating resin material, comprising:
the insulating resin material of claim 1; and
a metal layer disposed on at least one surface of the insulating resin material.

10. The metal layer-equipped insulating resin material according to claim 9, wherein the metal layer is brought into close contact with the at least one surface of the insulating resin material through intermediation of a fluorine-based resin layer.

11. The metal layer-equipped insulating resin material according to claim 10, wherein the metal layer is brought into close contact with the at least one surface of the insulating resin material through intermediation of the fluorine-based resin layer at a peel strength of 0.6 kN/m or more.

12. A wiring substrate, comprising the metal layer-equipped insulating resin material of claim 9, wherein the metal layer of the metal layer-equipped insulating resin material is subjected to patterning treatment.

* * * * *